United States Patent [19]
Hibbs-Brenner et al.

[11] Patent Number: 5,764,674
[45] Date of Patent: Jun. 9, 1998

[54] CURRENT CONFINEMENT FOR A VERTICAL CAVITY SURFACE EMITTING LASER

[75] Inventors: Mary K. Hibbs-Brenner, Plymouth, Minn.; James R. Biard, Richardson, Tex.

[73] Assignee: Honeywell Inc., Minneapolis, Minn.

[21] Appl. No.: 671,995

[22] Filed: Jun. 28, 1996

[51] Int. Cl.$^6$ .................. H01S 3/19; H01S 3/08
[52] U.S. Cl. .................. 372/46; 372/45; 372/96
[58] Field of Search .................. 372/46, 92, 96, 372/45, 99

[56] References Cited

U.S. PATENT DOCUMENTS

| | | |
|---|---|---|
| 5,056,098 | 10/1991 | Anthony et al. |
| 5,115,442 | 5/1992 | Lee et al. |
| 5,245,622 | 9/1993 | Jewell et al. ............ 372/46 |
| 5,256,596 | 10/1993 | Ackley et al. ............ 372/45 |
| 5,343,487 | 8/1994 | Scott et al. ............ 372/46 |
| 5,493,577 | 2/1996 | Choquette et al. ............ 372/45 |

OTHER PUBLICATIONS

R. Morgan et al., "Vertical–cavity surface–emitting laser arrays," (1995) SPIE, vol. 2398–09, Bellingham, WA. (Apr. 1995).

*Primary Examiner*—Rodney B. Bovernick
*Assistant Examiner*—Luong-Quyen T. Phan
*Attorney, Agent, or Firm*—John G. Shudy, Jr.

[57] ABSTRACT

A vertical cavity surface emitting laser having a planar structure, having an implantation or diffusion at the top of the mirror closest to the substrate or at the bottom of the mirror farthest from the substrate, to provide current confinement with the gain region, and having an active region and another mirror formed subsequent to the implantation or diffusion. This structure has an implantation or diffusion that does not damage or detrimentally affect the gain region, and does provide dimensions of current confinement that are accurately ascertained. Alternatively, the implantation or diffusion for current confinement may be placed within the top mirror, and several layers above the active region, still with minimal damage to the gain region and having a well-ascertained current confinement dimension.

24 Claims, 4 Drawing Sheets

CURRENT CONFINEMENT FOR A VERTICAL CAVITY SURFACE EMITTING LASER

BACKGROUND OF THE INVENTION

The present invention pertains to vertical cavity surface emitting lasers (VCSELs), and particularly to VCSELs having current confinement. More particularly, the invention pertains to VCSELs having refined current confinement caused by an implant or diffusion not having unwanted damage in the VCSEL structure.

Several patents address the issue of current confinement. U.S. Pat. No. 5,115,442 reveals a structure having a semiconductor quarterwave stack in both mirrors. The entire semiconductor epitaxial structure is deposited first, followed by a deep proton implant to confine the current. This is a commonly used structure. Its drawbacks include the fact that the top mirror is several microns thick, and therefore the implant must be so deep that one is limited in how small the current path can be made. Since the depth is so large, and there is significant straggle of implanted ions, the diameter of the current confined region cannot be made as small as one would like. This makes it more difficult to produce a single mode device and more difficult to keep the current required to reach the threshold for lasing small. In addition, damage is produced in proximity to the active region by the implant, which could eventually limit the lifetime of the device. The limit on size restricts performance. Furthermore, there are reliability concerns due to the proximity of the implanted region next to the gain region.

A second related U.S. Pat. No. 5,256,596 also provides for current confinement using ion implantation, but has a mesa etched before the implanting, so the implant depth is smaller. In that structure, a buried implant is used to provide current confinement. However, the entire epitaxial structure is deposited first, and a mesa must be etched before ion implant, in order to place the implant at the right depth, since the range of dopant atoms is quite small compared to protons. In fact, one can wonder whether the structure shown in FIG. 3 of that patent is even feasible, since it would require the implant of p- type atoms several microns below the surface. The disadvantages of this approach are that it results in a non-planar surface, and requires implantation through or close to the active region, thereby resulting in potential reliability problems.

U.S. Pat. No. 5,475,701, by Mary Hibbs-Brenner and issued Dec. 12, 1995, is hereby incorporated in this specification by reference.

SUMMARY OF THE INVENTION

This invention consists of a vertical cavity surface emitting laser in which the current is confined to the center of the device by the use of an implant or diffusion in mirror layers close to the active layers of either mirror; that is, the implant or diffusion may be placed at the top of the bottom mirror or at the bottom of the top mirror.

The approach outlined here involves a two step metalorganic chemical vapor deposition (MOCVD) growth. The first mirror is grown, and then implanted or diffused to provide current confinement. Then the remainder of the laser structure, i.e., the remainder of the first mirror, the gain region, and the second mirror, is deposited. The structure remains planar, thus facilitating the fabrication of high density arrays. The implant or diffusion is shallow (a few tenths of a micron), so the dimensions can be accurately controlled. The implant or diffusion is clearly below the active region, and ions do not need to be implanted or diffused through the active region. This approach provides a structure for improved reliability.

DESCRIPTION OF THE PREFERRED EMBODIMENT

Figure 1A:
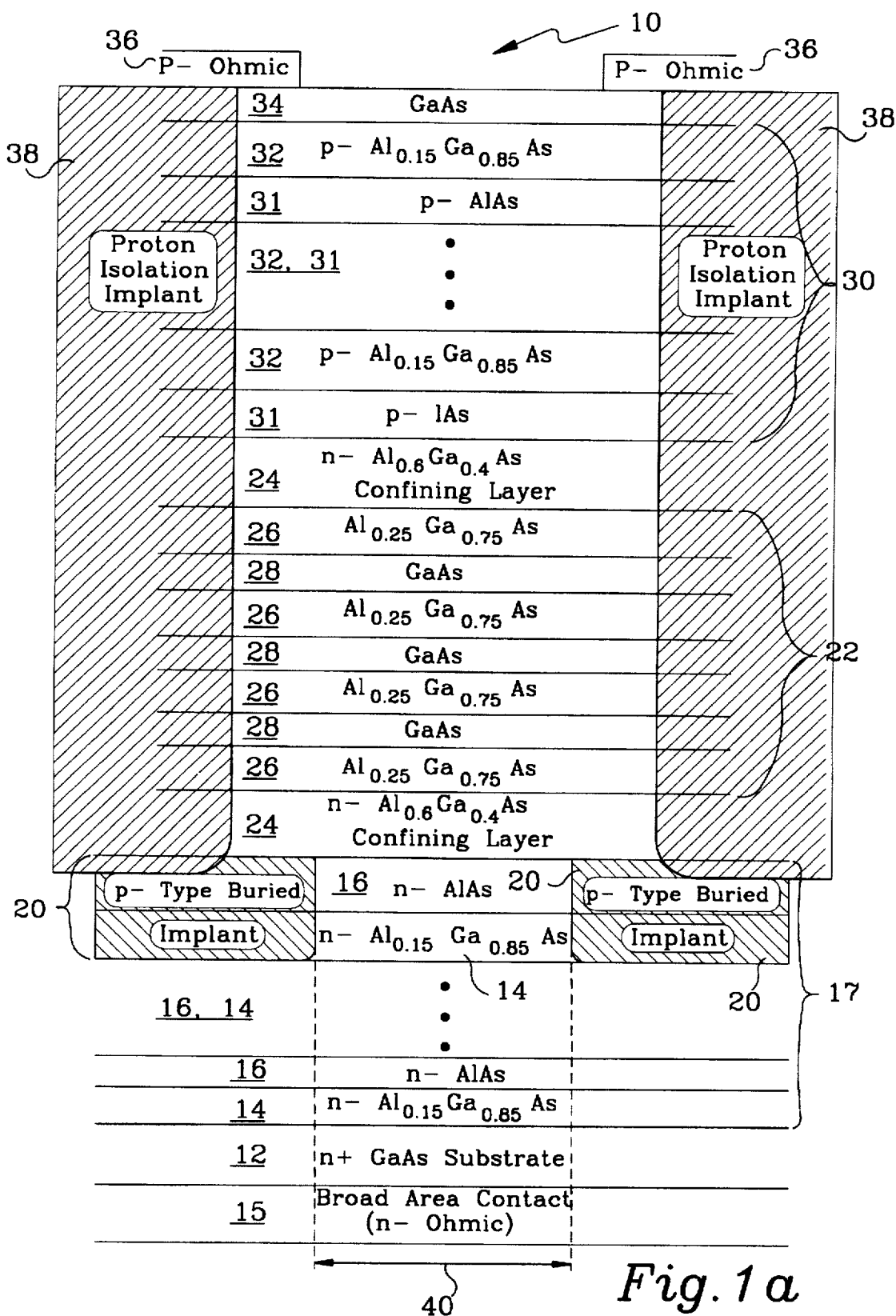
FIG. 1a is a diagram of a VCSEL having a current confining implant or diffusion below the active region.

FIG. 1a illustrates configuration 10 of the structure. In this version, alternating epitaxial layers 14 and 16 for laser 10 are deposited on a substrate 12 which is doped n- type. On the bottom side of substrate 12 is formed a broad area contact 15 (i.e., n- ohmic). A bottom mirror 17, consisting of 26 periods of alternating layers of AlAs 16 and $Al_xGa_{(1-x)}As$ (x=0.15 is preferred, but x may have any value greater than 0.05) 14, all doped n- type, are grown to form a highly reflecting mirror 17. The total number of mirror periods may be greater or less than 26, depending on other parameters. At the top of mirror 17, a p- type or electrically insulating dopant 20 is implanted or diffused in top layers 16 and 14 in order to block current flow on the perimeter of mirror 17, and confine the current to dimension 40. This p- or insulating dopant may be located between 0 and 10 periods (20 layers) below the first confining layers, but preferably is 2 periods below the first confining layer. It is preferable for the depth of implant 20 to be several tenths of a micron but may range between 0.1 and 2 microns. Dimension 40 may be between 0.1 and 60 microns, but is typically several microns, i.e., 2 to 5 microns. Several more mirror periods (0 to 10) may be formed on top of the implanted or diffused surface followed by the mid-portion of structure 10, which consists of two $Al_xGa_{(1-x)}As$ (x=0.6) confining layers 24. x may be 0.25 or greater. These layers 24 are most likely to be lightly doped, n-type on the layer nearest the n-doped mirror, and p-type on the layer nearest the p-type mirror, although there is a possibility that these could be left undoped. Layers 24 sandwich a region 22 having three GaAs quantum wells 28, separated from one another and confining layers 24 by four $Al_xGa_{(1-x)}As$ (x=0.25) barrier layers 26. The number of GaAs quantum wells may be from one to five. Alternatively, one could potentially have an active region 22 without quantum wells, e.g., a region having an emitting layer of about 0.2 micron thick. On top of confining layer 24 on active region 22, a p- type mirror 30 is grown, consisting of 18 periods of alternating layers of p- AlAs 31 and p- $Al_xGa_{(1-x)}As$ 32 (x=0.15 preferably, but may have any value greater than 0.05). The number of periods may be greater or less than 18, depending on other parameters. A GaAs contact layer 34 is formed on top of mirror 30. A proton isolation implant 38 is placed at the perimeter of contact layer 34, mirror 30, active region 22 and confining layers 24, to separate one device 10 from a like neighboring device on a chip. If a single laser chip 10 were to be made, then it is possible that one could eliminate this proton implant 38, if the implant or diffusion made on top of the n-mirror were to extend all the way to the edge of the chip. Laser 10 connections are formed by depositing at least one p- type ohmic contact 36 on the top surface of contact layer 34, and a broad area n- type ohmic contact 15 on the back side of wafer substrate 12. The resulting device 10 emits laser light in the range of 760 to 870 nanometers (nm).

Figure 1B:
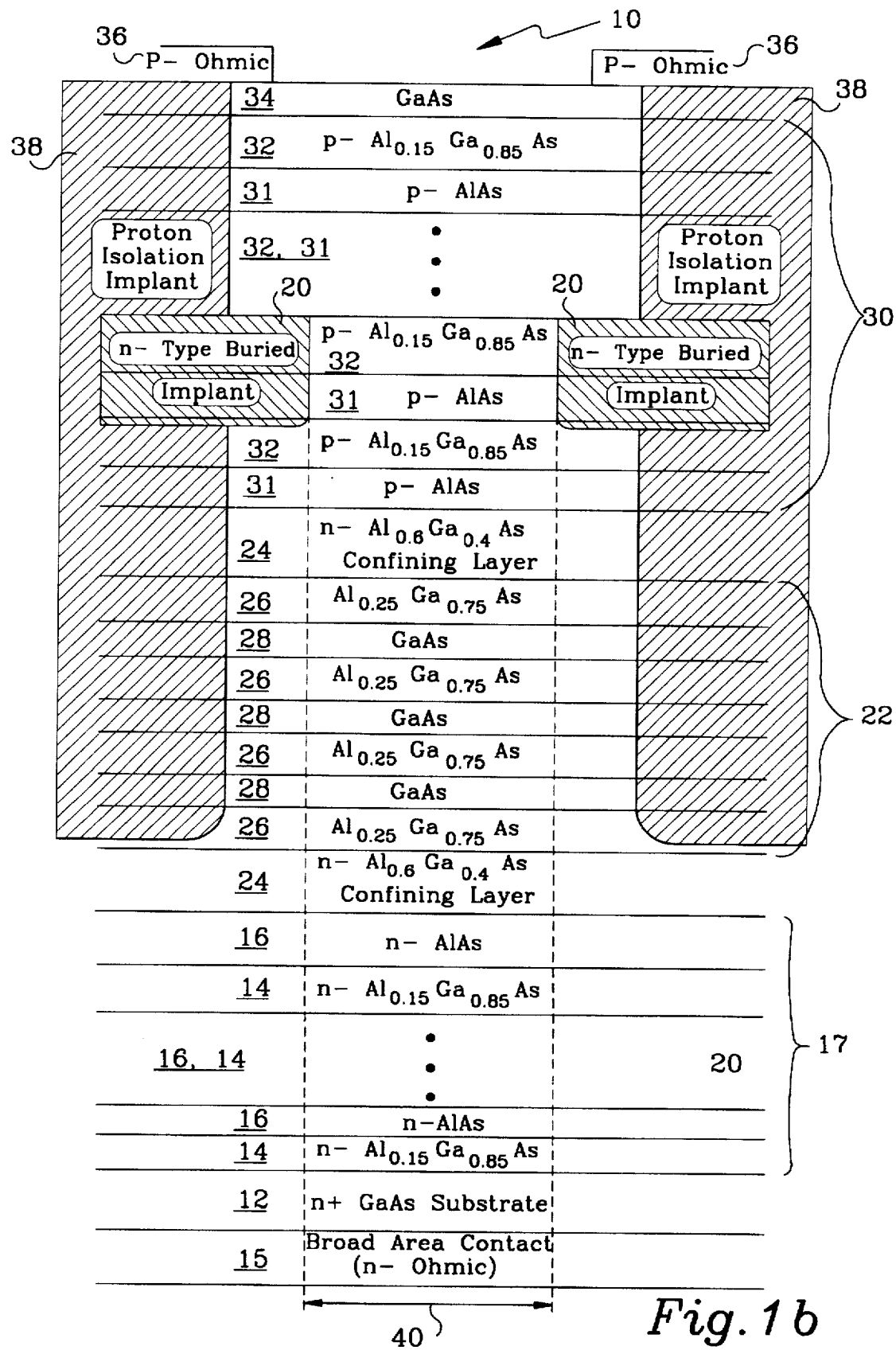
FIG. 1b shows a current confining implant or diffusion above the active region in the VCSEL.

FIG. 1b shows the same VCSEL structure as FIG. 1a, except that dopant 20 is implanted or diffused as an n- type or electrically insulating dopant in layers 31 and 32 of mirror 30, preferably several layers above confining layer 24, to function in blocking current flow from the perimeter of active region 22 and lower mirror 17, and to confine the current flow within dimension 40. Dopant 20 has similar dimensions as implant or diffusion 20 of FIG. 1a.

Figure 2A:
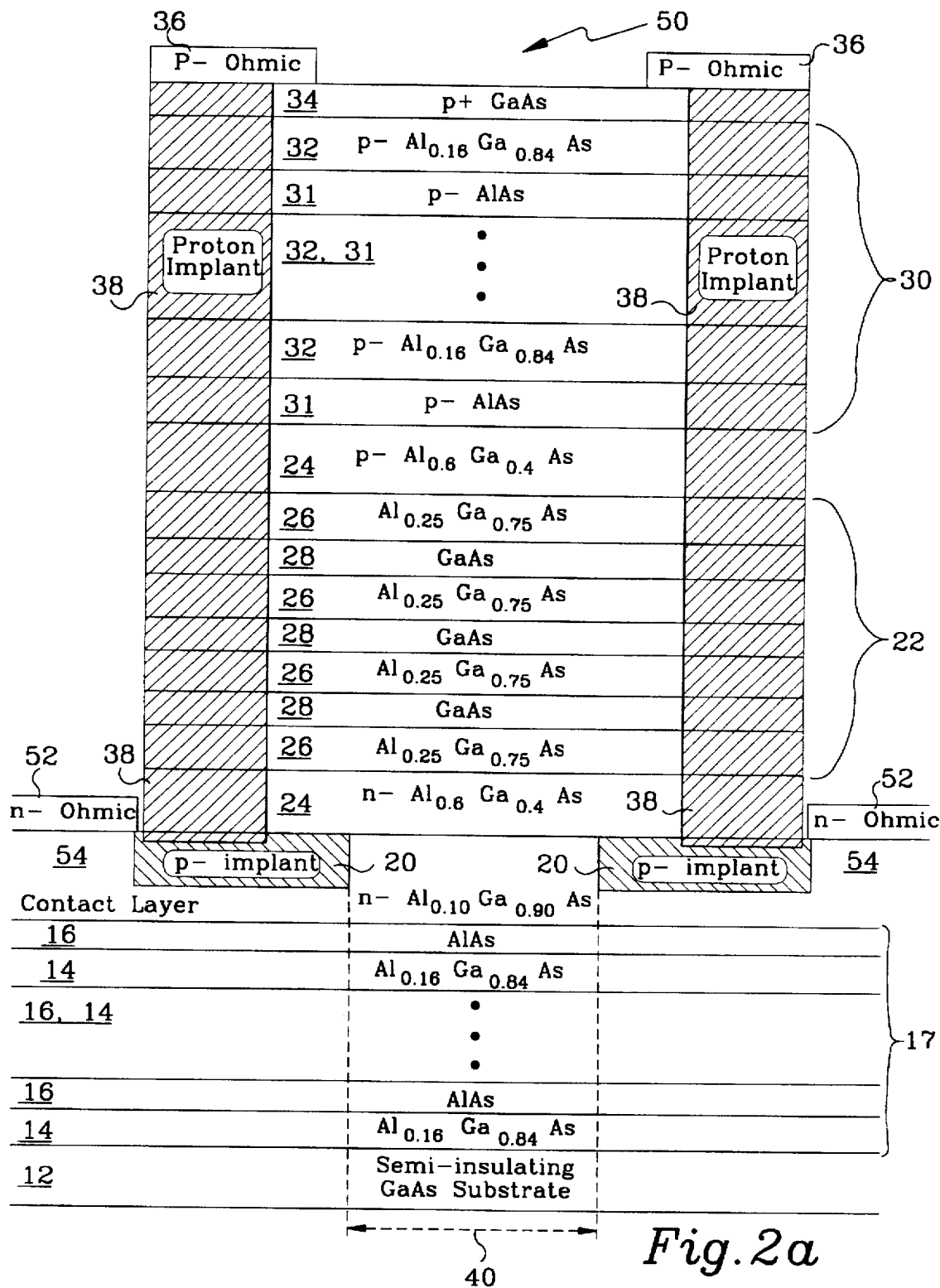
FIG. 2a is a diagram of another VCSEL, having a current confining implant or diffusion below the active region, that can be integrated with other electronic circuits.

FIG. 2a illustrates configuration 50 of the structure wherein both contacts of the p-n junction can be made from a top surface thereby permitting integration with electronic circuits or other devices on a semi-insulating substrate. In this version, epitaxial layers 14 and 16 for laser 50 are deposited on a semi-insulating substrate 12. A bottom mirror 17 has 26 periods (i.e., 52 layers) of alternating layers of AlAs 16 and $Al_xGa_{(1-x)}As$ (x=0.16) 14, of which all can be doped n- type, be entirely undoped, or be undoped except for the last few periods. Layers 16 and 14 are grown to form a highly reflecting mirror 17. A contact layer 54 of n- doped $Al_xGa_{(1-x)}As$ (x=0.10 but could range from 0.0 to 0.20) is formed on the top layer 16 of mirror 17. In contact layer 54, a p- type or electrically insulating dopant 20 is implanted or diffused in order to block current flow on the perimeter of mirror 17 and confine current flow to dimension 40. Dopant 20 has similar dimensions as implant 20 of FIG. 1a. Unlike the description for FIG. 1a, in this case, the p-type or electrically insulating dopant region cannot extend all the way to the edge of the chip, because it would then prevent us from making this n-ohmic contact 52. The p-type or electrically insulating implant or diffused area 20 looks like a ring. Dimension 40 is typically between two and five microns. The top and mid-portions of structure 50 form a mesa on contact layer 54, after etching. The mid-portion consists of two undoped $Al_xGa_{(1-x)}As$ (x=0.6 but may have a value of 0.25 or greater) confining layers 24 which sandwich a region 22 having three undoped GaAs quantum wells 28, separated from one another and confining layers 24 by $Al_xGa_{(1-x)}As$ (x=0.25 as preferred value) barrier layers 26. On top of confining layer 24 on active region 22, a p-type mirror 30 is grown, consisting of 18 periods of alternating layers of p- AlAs 31 and $p-Al_xGa_{(1-x)}As$ 32 (x=0.15 but x may be at a value of 0.05 or greater). A p+ GaAs contact layer 34 is formed on top of mirror 30. Layers 34, 31, 32, 26, 28 and 24 are etched on their perimeters down to the contact layer to form a mesa on layer 54. Proton isolation implant 38 may be inserted at the perimeter of contact layer 34, mirror 30, active region 22, and confining layers 24 of the mesa to isolate current from the edge of the mesa. Device 50 could still be fabricated without this proton implant, though it may be more reliable with it. The proton isolation implant may extend into a portion of contact layer 54 at a depth which is less than the thickness of layer 54. The distance between the inside edges of proton implant is between 10 and 100 microns. Laser 50 connections for the p-n junction are formed by depositing at least one p- type ohmic contact 36 on the top surface of contact layer 34, and at least one n-type ohmic contact 52 on an external surface of contact layer 54 outside the perimeter of the mesa incorporating active region 22 and mirror 30, and also outside the perimeter of the p-type or electrically insulating implant or diffusion.

Figure 2B:
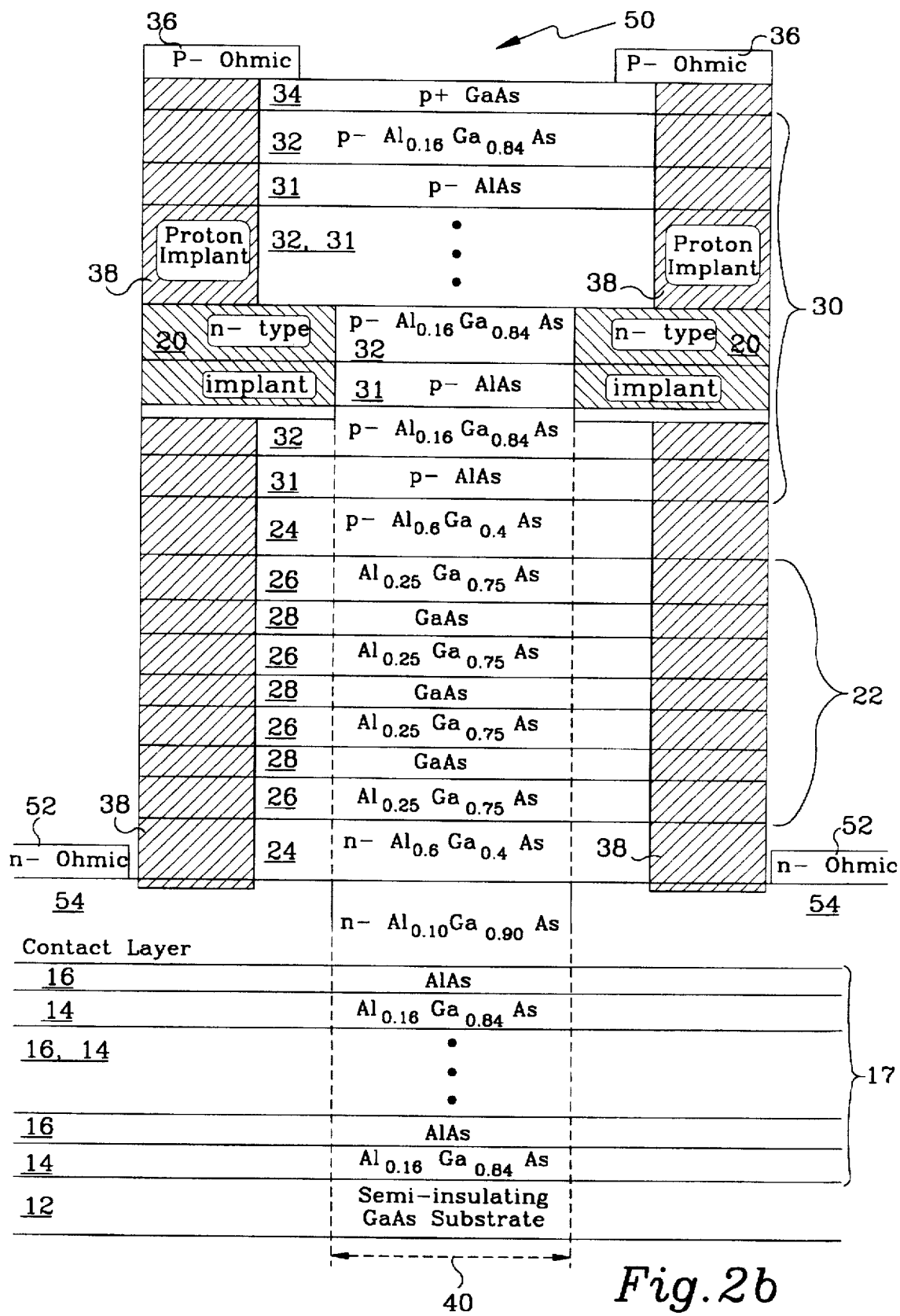
FIG. 2b shows the VCSEL of FIG. 2a but with the current confining implant or diffusion above the active region.

FIG. 2b shows the same VCSEL structure with similar dimensions and materials as FIG. 1a, except that the dopant 20 is implanted or diffused as an n- type or electrically insulating dopant in layers 31 and 32 of mirror 30, preferably several layers (0 to 10 periods, or 0 to 20 layers) above confining layer 24, to function in blocking current flow from the perimeter of active region 22 and lower mirror 17, and confining the current flow within dimension 40.

Device 10, 50 can be fabricated by epitaxially depositing an n- type mirror in an OMVPE (Organo-Metallic Vapor Phase Epitaxy) or MBE (Molecular Beam Epitaxy) reactor. The layers of device 10, 50 are removed from the reactor forming the layers, and photoresist is spun onto wafer 10, 50 and patterned in such a way as to protect the layers at an area for a center 40 of device 10, 50. The p-n-, or electrically insulating type dopant is implanted or diffused in a ring outside the protected area having diameter 40. Device 10, 50 is placed back in the epitaxial growth reactor, and the remaining layers of the structure are deposited. After growth of the material, the proton isolation implant 38, and n- and p- ohmic contact 15 and 36 depositions, respectively, are made using normal semiconductor processing techniques. When device 10, 50 is operated by applying a forward bias to the p-i-n junction formed by the top p- doped mirror 30, undoped, or lightly doped active region 22, and bottom n-doped mirror 17, the current is forced to flow only through unimplanted center 40 of device 10, 50.

In the present invention, which has advantages over the above-noted U.S. Pat. No. 5,115,442, the depth of the p- n-, or electrically insulating type implant or diffusion need only be a few tenths of a micron but may range from 0.1 to 2 microns. Therefore, the diameter 40 of the unimplanted or non-diffused region can be kept small to several microns, but may range from 0.1 to 60 microns, with the realization of needing only a very low current to reach lasing threshold, in the cases when this dimension is kept to just a few microns. In addition, the damage due to implant 20 is kept away from the active region 22 of laser 10 and 50, and thus increases device reliability.

This invention provides advantages over the structure disclosed in the above-noted U.S. Pat. No. 5,256,590. Since the epitaxial growth is carried out in two steps, with confining implant or diffusion 20 performed after the first growth, one need only implant or diffuse a few tenths of a micron. In the case of an implant, this limits the energies required, again allowing tighter control of dimensions, and eliminating the need for a mesa etch before the implant. That mesa etch exposes the very reactive AlAs layers 31 in top mirror 30, which would affect reliability. The lower implant 20 energies limit implant damage and magnitude of the implant straggle. In addition, by keeping implant 20 several periods above or below the active region 22, it keeps the reliability limiting implant away from the active layers of the laser.

Other configurations of the device would include the growth of a p- type mirror 17 first, with an n- type or electrically insulating implant or diffusion 20, followed by the active region 22 and an n- type mirror 30. In addition, InGaAs quantum wells 28 can be used for emission in the range of 870–1000 nm. In that case, light can be emitted from either the top or bottom surface of laser 10 or 50. Other materials can be used, such as the AlGaInP material system which results in a laser 10 or 50 emitting in the range 630–700 nm, or the InGaAsP material system for a device 10 or 50 emitting near 1.3 microns. Even in the case of the lasers emitting at 760–870 nm, the various compositions mentioned in the descriptions above can be varied, i.e., "x" compositions in the mirror might vary from 0.05 to 0.3, or the confining layer "x" compositions might vary from 0.4 to 0.8 at the mirrors and from 0.1 to 0.5 between the quantum wells.

We claim:

1. A vertical cavity surface emitting laser having refined current confinement, comprising:
   a substrate, having a first type of dopant, and first and second surfaces;
   a first contact layer, having a first type of dopant, formed on the first surface of said substrate;
   a first mirror, having a first type of dopant, formed on the second surface of said substrate;
   a first implant or diffusion, having a second type of dopant, formed in said first mirror, said implant or diffusion formed at the periphery of said first mirror with an inside dimension less than 5 microns, and a thickness less than 2 microns;
   an active region formed on a surface of said first mirror having said first implant or diffusion;
   a second mirror, having a second type of dopant, formed on said active region; and
   a second contact layer, having a second type of dopant, formed on said second mirror; and
   wherein:
      said first implant or diffusion confines current to a center of the vertical cavity surface emitting laser approximately according to the inside dimension of the periphery; and
      said vertical cavity surface emitting laser is a planar device.

2. The vertical cavity surface emitting laser of claim 1, wherein said active region has at least one quantum well.

3. The vertical cavity surface emitting laser of claim 1, further comprising a second implant formed at the periphery of said second contact layer, said second mirror and said active region.

4. A vertical cavity surface emitting laser having refined current confinement, comprising:
   a substrate;
   a first mirror, having a first dopant, formed on said substrate;
   a first contact layer, having the first dopant, formed on said first mirror;
   a first implant or diffusion, surface-implanted in a portion of said first contact layer, for confining current in said first mirror;
   an active region formed as a mesa on said first contact layer;
   a second mirror, having a second dopant, formed on said active region as part of the mesa; and
   a second contact layer formed on said second mirror as part of the mesa; and
   wherein said first implant or diffusion is situated in the periphery of said first contact layer and the periphery has an inside dimension less than 5 microns and said first implant or diffusion has a depth less than 2 microns into the first contact layer from an adjacent surface of said active region.

5. The vertical cavity surface emitting laser of claim 4, wherein said active region has at least one quantum well.

6. The vertical cavity surface emitting laser of claim 4, further comprising a second implant formed at the periphery of said second contact layer, said second mirror and said active region.

7. The vertical cavity surface emitting laser of claim 6, wherein a contact is formed on said first contact layer.

8. A vertical cavity surface emitting laser having refined current confinement, comprising:
   a substrate, having a first type of dopant, and first and second surfaces;
   a first contact layer, having a first type of dopant, formed on the first surface of said substrate;
   a first mirror, having a first type of dopant, formed on the second surface of said substrate;
   an active region formed on a surface of said first mirror having said first type of dopant;
   a second mirror, having a second type of dopant, formed on said active region;
   a first implant or diffusion, having a first type of dopant, surface-implanted in a portion of said second mirror, said implant at the periphery of said second mirror with an inside dimension less than 5 microns, and a thickness less than 2 microns; and
   a second contact layer, having a second type of dopant, formed on said second mirror; and
   wherein:
      said first implant or diffusion confines current to a center of the vertical cavity surface emitting laser approximately according to the inside dimension of the periphery; and
      said vertical cavity surface emitting laser is a planar device.

9. The vertical cavity surface emitting laser of claim 8, wherein said active region has at least one quantum well.

10. The vertical cavity surface emitting laser of claim 8, further comprising a second implant formed at the periphery of said second contact layer, said second mirror and said active region.

11. A vertical cavity surface emitting laser having refined current confinement, comprising:
   a substrate;
   a first mirror, having a first dopant, formed on said substrate;
   a first contact layer, having the first dopant, formed on said first mirror;
   an active region formed as a mesa on said first contact layer;
   a second mirror, having a second dopant, formed on said active region as part of the mesa;
   a first implant or diffusion, surface-implanted in a portion of said second mirror, for confining current in said second mirror; and
   a second contact layer formed on said second mirror as part of the mesa; and
   wherein:
      said first implant or diffusion is situated in the periphery of two adjacent layers of said second mirror; confining current in said second mirror;
      the periphery has an inside dimension less than 5 microns; and
      said first implant has a depth less than two microns of said second mirror.

12. The vertical cavity surface emitting laser of claim 11, wherein said active region has at least one quantum well.

13. The vertical cavity surface emitting laser of claim 11, further comprising a second implant formed at the periphery of said second contact layer, said second mirror and said active region.

14. The vertical cavity surface emitting laser of claim 13, wherein a contact is formed on said first contact layer.

15. A vertical cavity surface emitting laser having refined current confinement, comprising:

a substrate, having a first type of electrically conductive dopant, and first and second surfaces;

a first contact layer, having a first type of electrically conductive dopant, formed on the first surface of said substrate;

a first mirror, having a first type of electrically conductive dopant, formed on the second surface of said substrate;

a first implant or diffusion, having an insulating type of dopant, formed in said first mirror, said implant or diffusion formed at the periphery of said first mirror with an inside dimension less than 5 microns, and a thickness less than 2 microns;

an active region formed on a surface of said first mirror having said first implant or diffusion;

a second mirror, having a second type of electrically conductive dopant, formed on said active region; and a second contact layer, having a second type of electrically conductive dopant, formed on said second mirror; and wherein:

said first implant or diffusion confines current to a center of the vertical cavity surface emitting laser approximately according to the inside dimension of the periphery; and said vertical cavity surface emitting laser is a planar device.

16. The vertical cavity surface emitting laser of claim 15, wherein said active region has at least one quantum well.

17. The vertical cavity surface emitting laser of claim 15, further comprising a second implant formed at the periphery of said second contact layer, said second mirror and said active region.

18. A vertical cavity surface emitting laser having refined current confinement, comprising:

a substrate;

a first mirror, having a first type of electrically conductive dopant, formed on said substrate;

a first contact layer, having the first electrically conductive dopant, formed on said first mirror;

a first implant or diffusion having an electrically insulating dopant, surface-implanted in a portion of said first contact layer, for confining current in said first mirror;

an active region formed as a mesa on said first contact layer;

a second mirror, having a second type of electrically conductive dopant, formed on said active region as part of the mesa; and a second contact layer having a second type of electrically conductive dopant formed on said second mirror as part of the mesa; and wherein said first implant or diffusion is situated in the periphery of said first contact layer and the periphery has an inside dimension less than 5 microns and said first implant or diffusion has a depth less than microns into the first contact layer from an adjacent surface of said active region.

19. The vertical cavity surface emitting laser of claim 18, wherein said active region has at least one quantum well.

20. The vertical cavity surface emitting laser of claim 18, further comprising a second implant formed at the periphery of said second contact layer, said second mirror and said active region.

21. The vertical cavity surface emitting laser of claim 20, wherein a contact is formed on said first contact layer.

22. A vertical cavity surface emitting laser having refined current confinement, comprising:

a substrate, having a first type of electrically conductive dopant, and first and second surfaces;

a first contact layer, having a first type of electrically conductive dopant, formed on the first surface of said substrate;

a first mirror, having a first type of electrically conductive dopant, formed on the second surface of said substrate;

an active region formed on a surface of said first mirror having said first type of electrically conductive dopant;

a second mirror, having a second type of electrically conductive dopant, formed on said active region;

a first implant or diffusion, having an insulating dopant, in a portion of said second mirror, said implant at the periphery of said second mirror with an inside dimension less than five microns, and a thickness less than 2 microns; and a second contact layer, having a second type of electrically conductive dopant, formed on said second mirror; and wherein said first implant or diffusion confines current to a center of the vertical cavity surface emitting laser approximately according to the inside dimension of the periphery; and said vertical cavity surface emitting laser is a planar device.

23. The vertical cavity surface emitting laser of claim 22, wherein said active region has at least one quantum well.

24. The vertical cavity surface emitting laser of claim 22, further comprising a second implant formed at the periphery of said second contact layer, said second mirror and said active region.

* * * * *